United States Patent
Zollner et al.

(10) Patent No.: US 10,406,840 B2
(45) Date of Patent: Sep. 10, 2019

(54) METHOD AND COMPENSATOR FOR STABILIZING AN ENCODER SIGNAL

(71) Applicant: Océ Holding B.V., Venlo (NL)

(72) Inventors: Werner Zollner, Eitting (DE); Michael Mayr, Munich (DE); Guenter Gassner, Muehldorf (DE)

(73) Assignee: Océ Holding B.V., Venlo (NL)

( * ) Notice: Subject to any disclaimer, the term of this patent is extended or adjusted under 35 U.S.C. 154(b) by 0 days.

(21) Appl. No.: 16/023,168

(22) Filed: Jun. 29, 2018

(65) Prior Publication Data

US 2019/0001720 A1 Jan. 3, 2019

(30) Foreign Application Priority Data

Jun. 29, 2017 (DE) .......................... 10 2017 114 470

(51) Int. Cl.
*B41J 29/38* (2006.01)
*H03K 5/1534* (2006.01)

(52) U.S. Cl.
CPC ............ *B41J 29/38* (2013.01); *H03K 5/1534* (2013.01)

(58) Field of Classification Search
CPC ................ B41J 29/38; H03K 5/1534
See application file for complete search history.

(56) References Cited

U.S. PATENT DOCUMENTS

| 6,106,101 A | 8/2000 | Suzuki | |
|---|---|---|---|
| 7,292,256 B2* | 11/2007 | Lawther | G06T 15/503 345/592 |
| 7,530,658 B2* | 5/2009 | Igarashi | B41J 29/38 347/16 |
| 7,550,711 B2* | 6/2009 | Igarashi | G01D 5/34707 250/229 |
| 2009/0256613 A1 | 10/2009 | Suzuki | |

FOREIGN PATENT DOCUMENTS

DE 102011000220 A1 7/2012

OTHER PUBLICATIONS

Foreign action dated Mar. 21, 2018, application No. 10 2017 114 470.6.

* cited by examiner

*Primary Examiner* — Lamson D Nguyen
(74) *Attorney, Agent, or Firm* — Schiff Hardin LLP

(57) ABSTRACT

Aspects of the disclosure relate to a method and a compensator via which the input edges of the encoder signal of an encoder may be transformed into a compensated encoder signal such that requirements with regard to a dot resolution of a printing device and with regard to a maximum activation frequency of the dot generators of the printing device are satisfied.

13 Claims, 7 Drawing Sheets

US 10,406,840 B2

METHOD AND COMPENSATOR FOR STABILIZING AN ENCODER SIGNAL

CROSS REFERENCE TO RELATED APPLICATIONS

This patent application claims priority to German Patent Application No. 102017114470.6, filed Jun. 29, 2017, which is incorporated herein by reference in its entirety.

BACKGROUND

The disclosure relates to a method and a compensator for stabilizing an encoder signal. The encoder signal may be used for timing of the dot generators of a printing device, but is not limited thereto.

In a digital printing device, the generation of dots on a recording medium to be printed to can be derived from velocity-proportional and/or position-proportional signals, such as encoder or encoder signals. These encoder signals may be plagued with a jitter, i.e. with fluctuations or oscillations, wherein the jitter may depend on the desired dot resolution and/or on the desired print speed of the printing device. The jitter may negatively affect the print quality of the printing device.

To provide a high print quality and a stable operation of a printing device, a high precision and stability of the encoder signals and of the activation and/or triggering pulses derived therefrom for the dot generators is thus desirable. In particular at relatively high print speeds and/or at relatively high dot resolutions, jitter within the generated activation and/or trigger pulses may lead to a negative effect on the dot generators, since a maximum permissible printing frequency or activation frequency of the dot generators may be at least temporarily exceeded due to the jitter. The jitter-dependent negative effect on the dot generators may thereby in particular lead to a failure of dots (what are known as "missing dots"), to a degradation of the print quality due to nozzle failures, and to a fouling of the dot generators.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
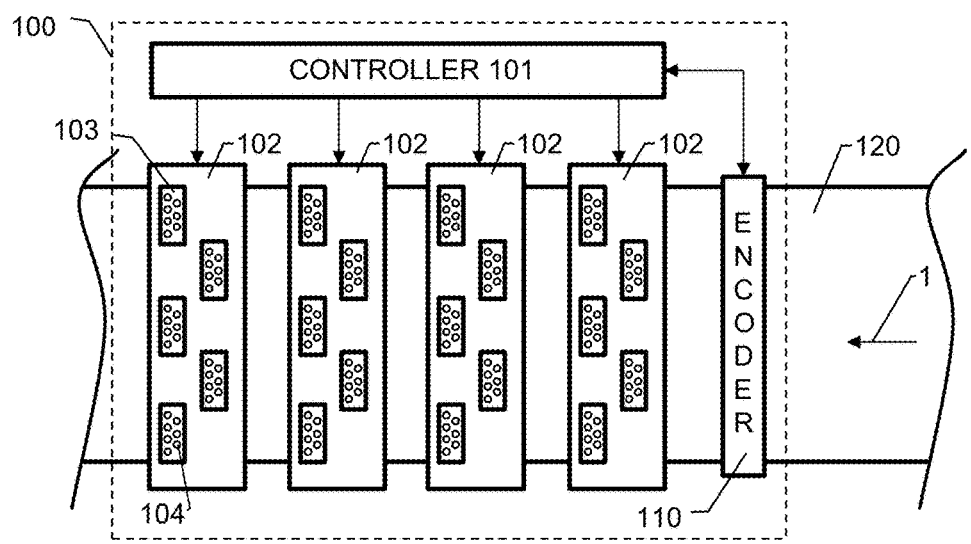
FIG. 1 illustrates a block diagram of an inkjet printer according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to provide a method and a compensator via which jitter may be reduced and/or at least partially compensated in velocity-proportional and/or position-proportional encoder signals for the generation of the activation pulses of the dot generators of a printing device, in particular in order to increase the print quality of the printing device.

According to one aspect, a method for determining at least one compensated encoder signal for the activation of dot generators of a printing device for printing dots on a recording medium is provided. In an exemplary embodiment, the method includes the determination of at least one encoder signal using an encoder for the detection of a dimension of a relative movement between the dot generators and the recording medium in a transport direction. Averaged over time, the encoder signal thereby enables a target dot resolution B in the transport direction if the dot generators are activated according to the encoder signal or according to the encoder signal down-clocked by a factor Q, wherein Q is a whole number with Q≥1. Moreover, in an exemplary embodiment, the method includes the generation of a sequence of output edges of the compensated encoder signal that corresponds to the sequence of input edges of the encoder signal such that, averaged over time, the target dot resolution B is achieved in the transport direction, and a maximum activation frequency of the dot generator is not exceeded, upon activation of the dot generators according to the compensated encoder signal or according to the compensated encoder signal down-clocked by the factor Q.

According to a further aspect, a compensator is described that is configured to determine at least one compensated encoder signal for the activation of dot generators of a printing device to print dots on a recording medium. In an exemplary embodiment, the compensator is configured to receive at least one encoder signal of an encoder for detecting a dimension of a relative movement between the dot generators and the recording medium in a transport direction. Averaged over time, the encoder signal thereby enables a target dot resolution B in the transport direction if the dot generators are activated according to the encoder signal or according to the encoder signal down-clocked by the factor Q, wherein Q is a whole number with Q≥1. In an exemplary embodiment, the compensator is additionally configured to generate a sequence of output edges of the compensated encoder signal that corresponds to the sequence of input edges such that, averaged over time, the target dot resolution B is achieved in the transport direction and a maximum activation frequency of the dot generators is not exceeded given activation of the dot generators according to the compensated encoder signal or according to the compensated encoder signal down-clocked by the factor Q.

As presented above, an object of the present disclosure is to reduce and/or compensate for jitter in an encoder signal that is provided by an encoder of a printing device.

FIG. 1 shows a block diagram of an inkjet printer as an example of a printing device 100 according to an exemplary embodiment. In an exemplary embodiment, the printing device 100 is designed for continuous printing, i.e. for printing to a "continuous" or web-shaped recording medium 120 (also referred to as a "continuous feed"), but the present disclosure is not limited to continuous printing devices. The recording medium 120 is typically taken off of a roll (the takeoff) and then supplied to the print group of the printing device 100. A print image is applied onto the recording medium 120 by the print group, and the printed recording medium 120 is taken up again (possibly after fixing/drying of the print image) onto an additional roll (the take up). Alternatively, the printed recording medium 120 may be cut into sheets or pages by a cutting device. In FIG. 1, the transport direction 1 of the recording medium 120 is represented by an arrow. The statements in this document are also applicable to a printing device for printing to recording media 120 in the form of sheets or pages. Furthermore, the statements are applicable to other printing devices (for example also to toner-based printing devices).

In an exemplary embodiment, the print group of the printing device 100 comprises four separate print bars 102 spaced apart from one another in the transport direction 1, but is not limited thereto. The different print bars 102 may be used for printing with inks of different colors (for example black, cyan, magenta and/or yellow). The print group may comprise additional print bars 102 for printing with additional colors.

Each print head 103 comprises multiple nozzles 104 as an example of dot generators, wherein each nozzle 104 is configured to fire ink droplets onto the recording medium 120. For example, a print head 103 may comprise 2558 or 5312 effectively utilized nozzles 104 that are arranged along one or more rows transversal to the transport direction 1 of the recording medium 120. The nozzles 104 in the individual rows may be arranged offset from one another. A respective line on the recording medium 120 may be printed transversal to the transport direction 1 by means of the nozzles 104 of a print head 103. An increased dot resolution transversal to the transport direction 1 may be provided via the use of multiple rows with transversally offset nozzles 104. In total, for example, K=12790 or K=26560 droplets may be fired along a line onto the recording medium 120 by a print bar 102 depicted in FIG. 1 (for example, for a print width of approximately 54 cm at a resolution of 600 dpi (dpi=dots per inch) or 56 cm at a resolution of 1200 dpi). It is to be noted that any arbitrary print width with any arbitrary resolution is possible.

In an exemplary embodiment, the printing device 100 additionally comprises at least one controller 101 (e.g. an activation hardware and/or a print controller) that is configured to activate the actuators of the individual nozzles 104 of the individual print heads 103 in order to apply a print image onto the recording medium 120, depending on print data. Each print bar 102 may thereby have a separate controller 101 so that a separate controller 101 is assigned to each color. In an exemplary embodiment, the controller 101 includes processor circuitry that is configured to activate the actuators.

In an exemplary embodiment, the printing device 100 thus comprises at least one print bar 102 having K nozzles 104 that may be activated with a defined line signal in order to print a line (transversal to the transport direction 1 of the recording medium 120) with K dots or K columns onto the recording medium 120. Due to the arrangement in multiple rows, the nozzles of a print head 103 are typically activated with a (fixed) time offset relative to one another in order to print a line. In the presented example, the nozzles are installed immobile or fixed in the printing device 100, and the recording medium 120 is directed past the stationary nozzles 103 at a defined transport velocity (for example 80 m/min). A specific nozzle 104 may print the dots of a corresponding column traveling in the transport direction 1 onto the recording medium 120. This configuration is referred to as a 1:1 association, since one nozzle 104 is associated with each column. A maximum of one ink ejection thus takes place per line of a print image via a specific nozzle 104.

Figure 2A:
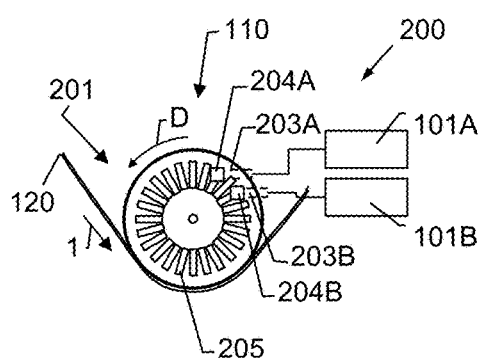
FIGS. 2a, 2b illustrate an encoder according to an exemplary embodiment viewed from different perspectives.
Figure 2B:
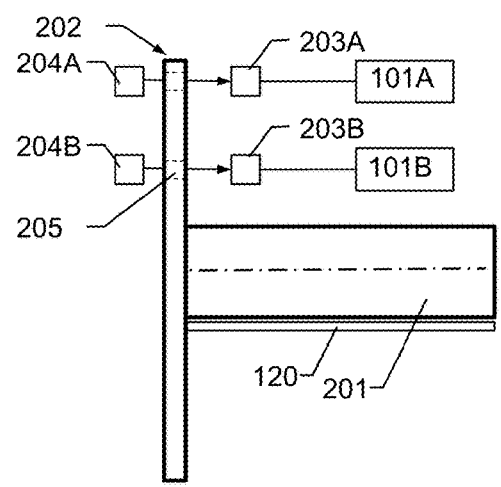

In an exemplary embodiment, the printing device 100 also comprises a rotary encoder or encoder 110 that is configured to provide a base clock to determine the line signal for the activation of the nozzles of the printing device 100. As is presented from different perspectives in FIGS. 2a and 2b, the rotary encoder 110 comprises an encoder roller 201 that is driven by the recording medium 120 moving in the transport direction 1 and moves (without slippage) with the recording medium 120. One revolution of the encoder roller 201 thus corresponds to a specific travel d of the recording medium 120 (for example d=200 mm).

Figure 3A:
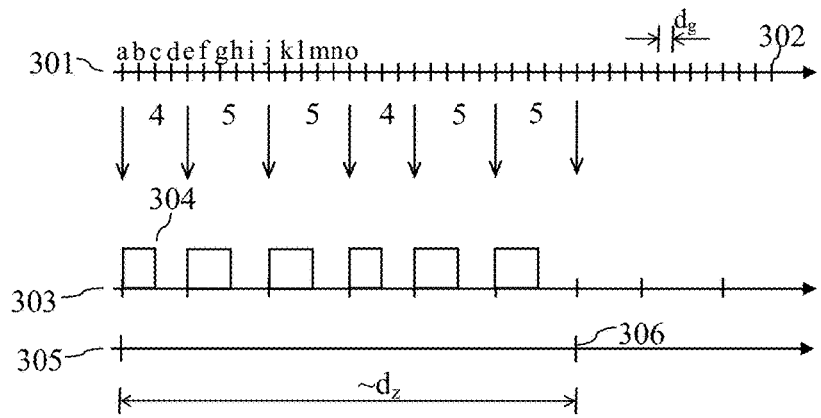
FIG. 3a illustrates the generations of the edges of an encoder signal according to an exemplary embodiment.

In an exemplary embodiment, the rotary encoder 110, in particular an incremental encoder, moreover comprises at least one rotary encoder 200 that, for example, has a disc 202 provided with slits 205 that is located between a first light-emitting diode 204A and at least one first photodetector 203A. In an exemplary embodiment, the first light-emitting diode 204A and the first photodetector 203A are configured to cooperatively detect the rotation direction D of the disc 202. In an exemplary embodiment, a second light-emitting diode 204B and respective second photodetector 203B may also be provided to detect the rotation direction D of the disc 202. In an exemplary embodiment, the two photodetectors 203A and 203B are arranged slightly offset from one another so that two preferably square signals A and B that are electrically phase-shifted (e.g. by 90°) are generated upon rotation of the disc 202. In an exemplary embodiment, an AB-counter may determine the rotation direction of the disc 202 from these two signals and count the edge changes of the electrical signals of the photodetectors 203. In an exemplary embodiment, in total, up to four clock signals are generated per slit 205, which in this document are designated as base clock signals. A sequence of base clock signals may thus be generated by the rotary encoder 110. With reference to FIG. 3a, the distance between two adjacent base clock signals thereby corresponds to a specific traveled base clock travel $d_g$ of the recording medium 120 (for example $d_g$=200 mm/262.144≈763 nm, wherein the circumference of the disc 202 is 200 mm, for example, and the disc 202 has 65536 slits 205, for example, and four base clock signals are generated per slit 205). A sequence of 262144 base clock signals may consequently be generated via the exemplary encoder 110 per rotation of the encoder roller 201.

The number of lines that are printed on a defined travel of the recording medium 120 in the transport direction 1 depends on the dot resolution in the transport direction 1. In an exemplary embodiment, given a resolution of 1200 dpi, a line of a print image corresponds to a travel of the recording medium 120 of approximately 21.2 μm. At 600 dpi, the line pitch corresponds to 42.33 μm. A line signal should thus be provided with a sequence of line clock signals so that the pitch between two line clock signals corresponds to a travel $d_z$ of the recording medium 120 of $d_z$=21.2 μm. The line signal should thereby be determined on the basis of the base clock generated by the encoder 110. On the basis of the base clock, an encoder signal having a sequence of encoder signal periods may be determined and output by the encoder 110. The line signal may then be determined by down-clocking the encoder signal by the factor Q, wherein Q is a whole number, in particular with Q≥6 (for example Q=6 or 12). A line of the print image may thus be printed with every $Q^{th}$ encoder signal period.

In an exemplary embodiment, the required line travel $d_z$, is not a whole-number multiple of the base clock travel $d_g$, but is not limited thereto. This depends on, among other things, it being possible to flexibly adapt a dot resolution in the transport direction 1 as necessary, and thus to change the line travel $d_z$. Alternatively or additionally, the base clock travel $d_g$ may depend on the thickness of the recording medium 120 if the recording medium 120 is at least partially wound around the encoder roller 201. Ratios between $d_z$ and $d_g$ may thus result that are not whole numbers.

In an exemplary embodiment, the rotary encoder 110 is configured to provide an encoder signal with a sequence of encoder signal periods based on the base signal, where the encoder signal periods on average indicate the desired line travel $d_z/Q$. For this purpose, the rotary encoder 110 may vary the number of base clock signals within an encoder signal period such that, averaged over time, the desired line pitch $d_z/Q$ results.

FIG. 3a shows an example of a base signal 301 having a sequence of base clock signals 302 according to an exemplary embodiment. In the depicted example, a few base clock signals 302 that directly follow one another in succession are identified with "a", "b", "c", "d", "e", "f", "g", "h", "i", "j", "k", "l", "m", "n", "o". As presented above, an exemplary encoder 110 generates 262144 base clock signals 302 per rotation of the encoder roller 201. For a dot resolution of 1200 dpi, it may be necessary that 56086 encoder clock signals 304 of an encoder signal 303 are generated per rotation. A clock ratio of ≈4.6 thus results. This clock ratio may be realized on average in that the number of base clock signals 302 for an encoder signal period 304 is varied randomly between 4 and 5, wherein the random variations have a mean value of 4.6.

In the example of FIG. 3a, a respective encoder signal period 304 is generated for the base clock signals "a", "e", "j", "o" etc. The encoder signal periods 304 thus include 4, 5, 5, 4, 5, 5 etc. base clock signals 302. The line signal 305 may then be generated from the encoder signal 303 by down-clocking or under sampling by the factor Q (for example Q=6 in the example shown in FIG. 3a), such that a line clock signal 306 is generated for every $Q^{th}$ encoder signal period 304. The printing of a line of a print image may then be initiated with each line clock signal 306. With chronological averaging, the desired dot resolution may thus be achieved.

Figure 3B:
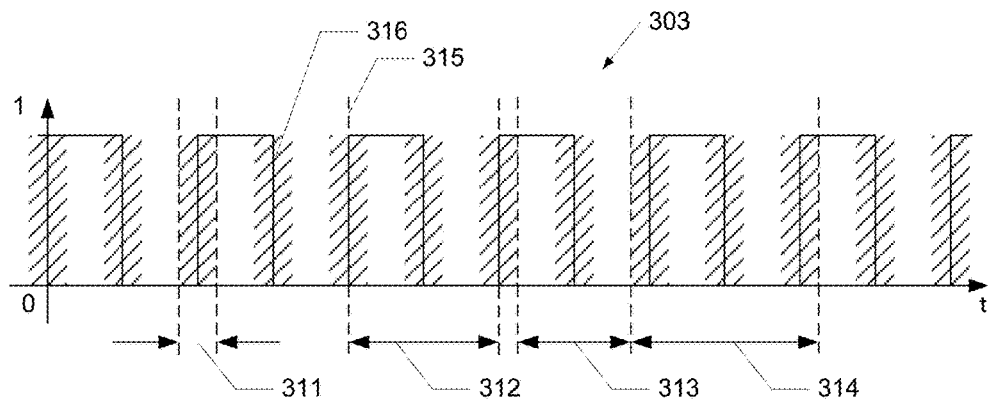
FIG. 3b illustrates an example of a time curve of an encoder signal according to an exemplary embodiment.

The rotary encoder 110 may thus provide one or more encoder signals 303 on the basis of the base signal 301 (for example, an A track encoder signal and a B track encoder signal), wherein the periods 304 of the encoder signal 303 indicate on average the desired travel $d_z/Q$ of the recording medium 120. However, these encoder signals 303 exhibit fluctuations or jitter, as illustrated in FIG. 3b. FIG. 3b shows an encoder signal 303 that repeatedly changes between a first level (for example a low level) and a second level (for example a high level), and thus includes alternating rising edges 315 and falling edges 316. The edges 315, 316 of the encoder signal 303 are also referred to as input edges 315, 316 in the present disclosure.

As shown in FIG. 3b, the distances between two rising edges 315 in direct succession, or between two falling edges 316 in direct succession, corresponds to a period 304 of the encoder signal 303. The period duration 312, 313, 314 thereby varies due to the jitter or the fluctuations 311 (shaded in FIG. 3b) of the edges 315, 316. In particular, the period duration 312, 313, 314 may deviate from a mean period duration 312 and fluctuate between a minimum period duration 313 and a maximum period duration 314.

As already presented above, the line signal 305 with the sequence of line clock signals 306 may be generated via under sampling of the encoder signal 303. In particular, a line clock signal 306 may be generated for every $Q^{th}$ rising edge 315 or for every $Q^{th}$ falling edge 316.

In an exemplary embodiment, the print heads 103 of a printing device 100 have only a limited print frequency or activation frequency (for example 64 kHz). At a relatively high transport velocity of the recording medium 120, for example of 80 m/min, and/or at a relatively high dot resolution in the transport direction 1 (for example 1200 dpi), it may occur that, given a sequence of relatively closely situated edges 315, 316, the time between two line clock signals 306 is so short that the maximum possible activation frequency of a print head 103 is exceeded. The random fluctuations or the jitter 311 of an encoder signal 303 may thus lead to negative effects in the activation of the print heads 103 of a printing device 100, and thus to a negative effect on the print quality.

Figure 4A:
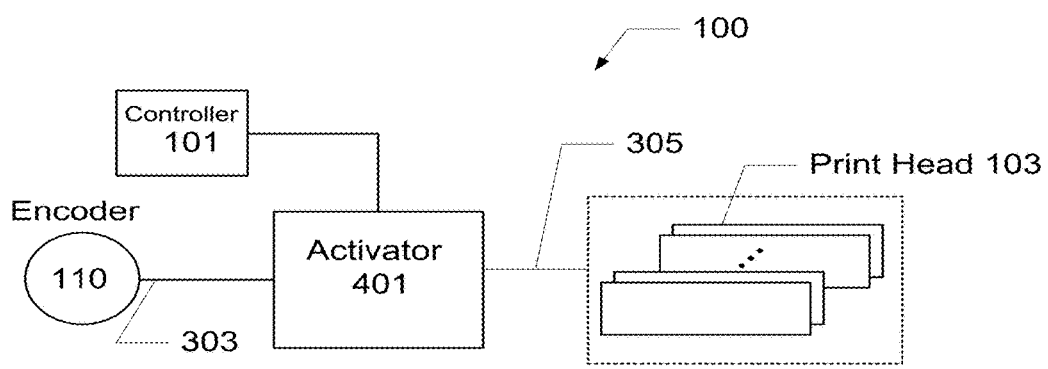
FIG. 4a illustrates an example of a printer according to an exemplary embodiment.
Figure 4B:
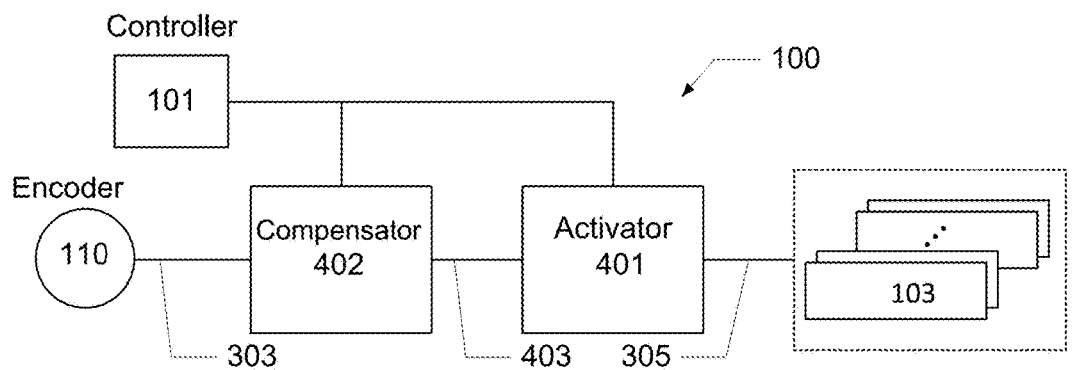
FIG. 4b illustrates an example of a printer having a compensator according to an exemplary embodiment.

FIG. 4a illustrates an example of a printing device 100 with an activator 401 according to an exemplary embodiment. In an exemplary embodiment, the activator 401 is configured to generate, based on an encoder signal 303 of an encoder 110, a line signal 305 having a sequence of line clock signals 306 for the activation of the one or more print heads 103 of the printing device 100. In an exemplary embodiment, the activator 401 includes processor circuitry that is configured to perform one or more functions of the activator 401, including generating the line signal 305. FIG. 4b shows a printing device 100 according to an exemplary embodiment that includes an additional compensator 402 that is configured to generate a compensated encoder signal 403 based on the encoder signal 303. In an exemplary embodiment, the compensator 402 includes processor circuitry that is configured to perform one or more functions of the compensator 402, including generating the compensated encoder signal 403. Instead of the encoder signal 303, the compensated encoder signal 403 may then be used by the activator 401 as a basis for the generation of the line signal 305. The activator 401 may thereby remain unchanged. Via the compensated encoder signal 403, it may be ensured that the maximum possible activation frequency of the print heads 103 of the printing device 100 is not exceeded.

Figure 4C:
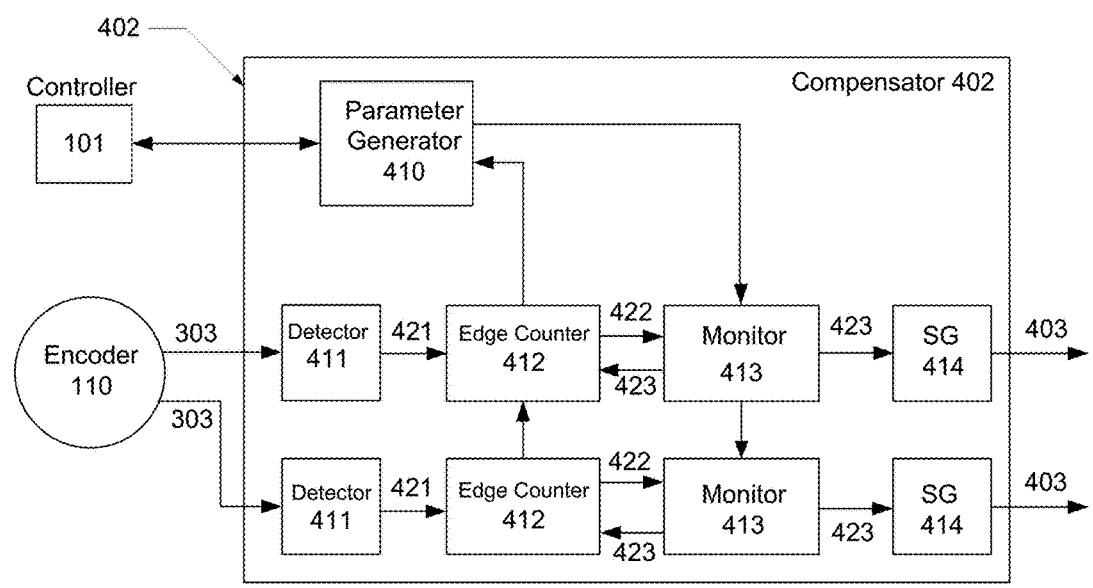
FIG. 4c illustrates a compensator according to an exemplary embodiment.

FIG. 4c shows details of a compensator 402 according to an exemplary embodiment of the present disclosure. In an exemplary embodiment, the compensator 402 comprises a parameter generator 410 configured to establish defined parameters, for example, the maximum possible activation frequency of the print heads 103. In an exemplary aspect, the parameter generator 410 is a parameter determiner or parameter device. Furthermore, in an exemplary embodiment, the compensator 402 comprises two processing lanes (e.g. signal processing paths) to process the encoder signal 303 of an A track and the encoder signal 303 of a B track of the encoder 110. In an exemplary embodiment, the processing lanes are of substantially identical design, but is not limited thereto. Compensated encoder signals 403 for the A track and for the B track may be generated via the two processing lanes.

In an exemplary embodiment, a processing lane comprises a detector 411 that is configured to detect the rising input edges 315 and the falling input edges 316 of an encoder signal 303 and generate an edge pulse 421 for each input edge 315, 316. Edge counter 412 is configured to determine the number of edge pulses 421. In particular, an edge count value 422 may be updated in the edge counter 412. In an exemplary embodiment, a processing lane additionally comprises a monitor 413 that is configured to determine a time since generation of an edge of the compensated encoder signal 403. Furthermore, the monitor 413 is configured to generate a decrement pulse 423 if specific conditions for generation of an additional edge of the compensated encoder signal 403 are satisfied. Within the edge counter 412, the decrement pulse 423 produces a reduction of the edge count value 422, in particular by precisely one edge. Furthermore, signal generator 414 is configured to generate an edge of the compensated encoder signal 403 based on the decrement pulse 423. The edges of the compensated encoder signal 403 are also referred to as output edges in the present disclosure. To generate an output edge, the compensated encoder signal 403 may be set to the second level (for example the high level) starting from the first level (for example the low level), or may be set to the first level starting from the second value.

By checking conditions in the monitor 413, it may be ensured that the compensated encoder signal 403 on average indicates the desired travel $d_z/Q$ of the recording medium 120, and that the distance between the output edges of the compensated encoder signal 403 is not below a minimum time separation, which ensures that the maximum possible activation frequency of a print head 103 of the printing device 100 is not exceeded. Via the compensator 402 depicted in FIG. 4c, a compensated encoder signal 402 may thus be generated in a robust and reliably manner in order to be able to provide a high print quality even at high print speeds and/or at high print resolutions. In an exemplary embodiment, one or more components (410, 411, 412, 413, and/or 414) of the compensator 402 includes processor circuitry that is configured to perform one or more of their respective functions as described herein.

Figure 5A:
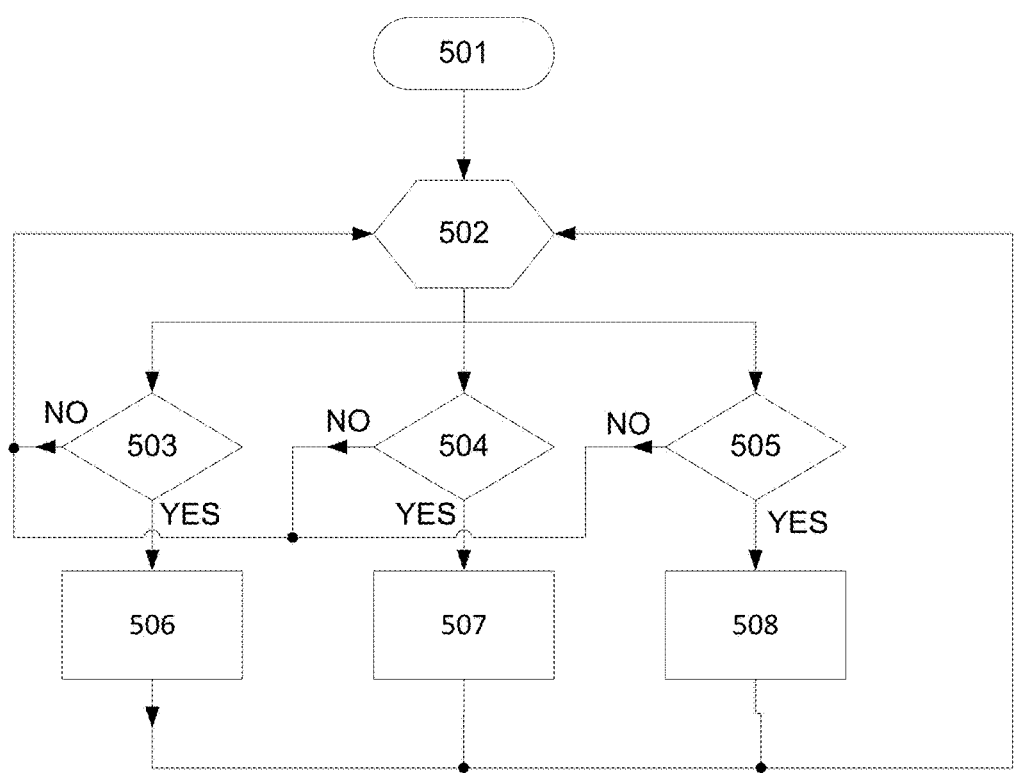
FIG. 5a illustrates a workflow diagram of a method for determining an edge count value according to an exemplary embodiment.

FIG. 5a shows a workflow diagram of an example of a method 500 for determining and updating an edge count value 422 according to an exemplary embodiment. In an exemplary embodiment, the method 500 is executed by the edge counter 412. First, the edge count value 422 is initialized (step 501). For example, upon startup of the printing device 100 the edge count value 422 may be initialized at a value of zero. A check may then be made repeatedly, preferably with each timing pulse of an FPGA (Field Programmable Gate Array), as to whether an event has occurred (step 502). Examples of events are, for example, the presence of a rising or falling input edge 315, 316 in the encoder signal 303 (step 503), for example the presence of a decrement pulse 423 (step 505) or, for example, the presence of an external initialization (step 504). If one of these events is present, the edge count value 422 may be adapted depending on the event. In particular, the edge count value 422 may be increased, in particular by precisely a value of one, if an input edge 315, 316 has been detected (step 506). On the other hand, the edge count value 422 may be decremented, in particular by precisely a value of one, if a decrement pulse 423 has been detected (step 508). If applicable, it may thereby be ensured that the edge count value 422 does not fall below a value of zero. Furthermore, a re-initialization of the edge count value 422 may be performed if an external initialization has been detected (step 507).

Figure 5B:
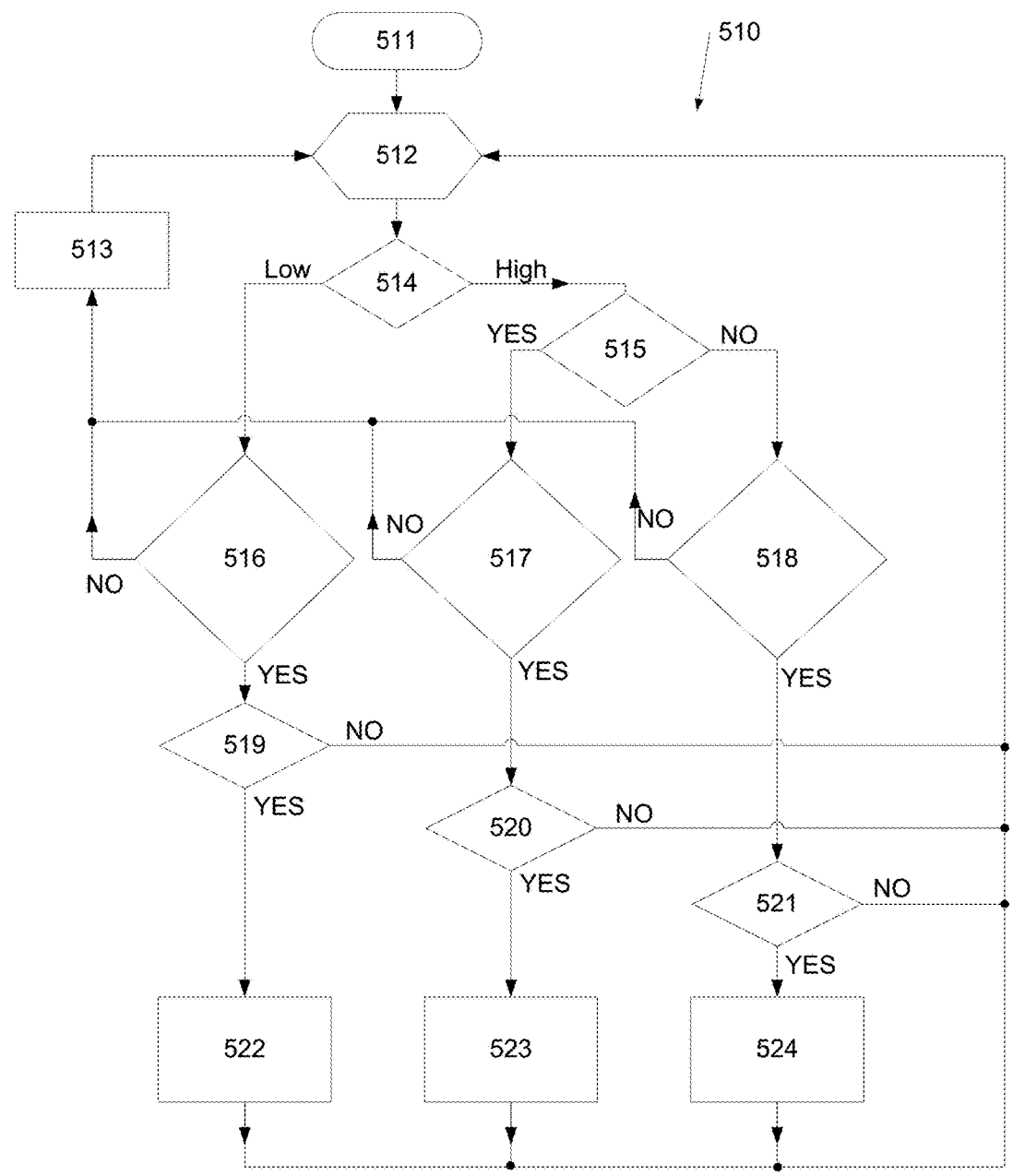
FIG. 5b illustrates a workflow diagram of a method for generation of decrement pulses to generate an output edge of a compensated encoder signal according to an exemplary embodiment.

FIG. 5b shows a workflow diagram of an example of a method 510 for generating a decrement pulse 423 according to an exemplary embodiment. In an exemplary embodiment, the method 510 is executed in (or by) the monitor 413. First, for example, upon startup of the printing device 100, a print period count value is initiated (step 511). The print period count value may be increased depending on a timing pulse. For example, the timing pulse may thereby be generated by an oscillator, for example by the oscillator of an FPGA (meaning a Field Programmable Gate Array) via which the method 510 is also executed. The timing pulse supplies periodic timing pulse signals that have a fixed time interval relative to one another. On the basis of the timing pulse, a check may thus be made as to whether the required minimum time for the printing of two dots by a dot generator is complied with.

At every timing pulse signal (step 512), the print period count value may be increased, for example by a value of one (step 513). Furthermore, a check may be made as to whether the print period count value has reached or exceeded a minimum count value (steps 516, 517, or 518). The minimum count value thereby corresponds to the minimum time interval between two output edges of the compensated encoder signal 403, via which it is ensured that the maximum activation frequency of the dot generators is not exceeded.

As long as the print period count value has not reached the minimum count value, and thus the elapsed time since the last output edge has not yet reached the minimum time interval, the next timing pulse signal is waited for (step 512). Otherwise, a check is made as to whether the edge count value 422 is greater than zero or not (steps 519, 520 or 521). If this is the case, a decrement pulse 423 may be generated (steps 522, 523, 524). Furthermore, the print period count value may be re-initialized or reset again, for example be set to zero or to one. Otherwise, if the edge count value 422 is not greater than zero and thus no outstanding input edge 315, 316 of the encoder signal 303 is present for which a corresponding output edge of the compensated encoder signal 403 has not yet been generated, the next timing pulse signal is waited for (step 512).

The minimum count value for monitoring of the print period count value depends on the maximum printing or activation frequency $f_{max}$ of the dot generators of the printing device 100. The minimum time interval $T_{min}$ between the printing of directly successive lines results from the maximum activation frequency $f_{max}$ as $T_{min}=1/f_{max}$. The time interval between two timing pulse signals of the timing pulse may be designated as $T_{zt}$. Furthermore, it is to be considered that lines are printed for all Q periods of the compensated encoder signal 403. A period of the compensated encoder signal 403 thereby includes an edge pair made up of a rising output edge and a directly following falling output edge. The rounded-up whole-number value of $T_{min}/QT_{zt}$ thus results for the minimum period count value for a period of the compensated encoder signal 403, for example. The minimum count value for each output edge may then substantially amount to half of the minimum period count value.

The method 510 presented in FIG. 5b differs by which level (high/low) the compensated encoder signal 403 has. For this purpose, in step 514 a check is made as to whether the compensated encoder signal 403 is located at the first level (meaning "low", for example) and a rising output edge must be generated with the next generated decrement pulse 423, or whether the compensated encoder signal 403 is located at the second level (meaning "high", for example) and therefore a falling output edge must be generated with the next generated decrement pulse 423. Steps 516, 519, 522 are executed to generate a decrement pulse 423 to produce a rising output edge. Steps 515, 517, 518, 520, 521, 523, 524 are provided to generate a decrement pulse 423 to produce a falling output edge.

The high phase of the compensated encoder signal 403 may possibly be used for a continuing approximation of Q periods of the compensated encoder signal 403 to $T_{min}$. As presented above, Q periods of the compensated encoder signal 403 are typically combined in order to generate a line clock signal 306 of the line signal 305. The compensated encoder signal 403 is thereby to be generated such that the Q periods do not fall below the minimum time interval $T_{min}$. Moreover, the output edges of the compensated encoder signal 403 should follow the corresponding input edges 315, 316 of the encoder signal 403 as promptly as possible, meaning that it should be avoided that the edge count value 422 is established and thus a "backpressure" of input edges 315, 316 of the encoder signal 303 is created. Such a "backpressure" may lead to registration inaccuracies between the different print colors, in particular given a multicolor printing with multiple print bars 102.

The minimum period count value for a period of the compensated encoder signal 403 may be the value of $T_{min}/(QT_{zt})$, rounded up to a whole number. In particular given a relatively low time resolution of the timing pulse, meaning in particular given a relatively large value of $T_{zt}$, the minimum time interval $T_{min}$ may only be relatively roughly approximated by the minimum period count value. This leads to the situation that the time length of periods of the compensated encoder signal 403 may, averaged over time, be relatively far beyond the required value $T_{min}/Q$. In order to compensate for this, at least every $Q^{th}$ period of the compensated encoder signal 403 may be shortened by a defined shortening value. This shortening value may thereby result from the difference between the rounded-up value of $T_{min}/(QT_{zt})$ and the exact value of $T_{min}/(QT_{zt})$. The shortening value may in particular correspond to the rounded-down whole number value of the Q-fold difference.

The minimum period count value may, for example, be reduced by the shortening value for every $Q^{th}$ period of the compensated encoder signal 403. Alternatively, the shortening value may be distributed to multiple of the Q periods, for example respectively half of the shortening value to two of the Q periods. Via the consideration of a shortening value, a "backpressure" of input edges 315, 316 of the encoder signal 303 and inaccuracies in the print image that are connected with this may be avoided. In step 515 of the method 500, the number of periods is counted, and a check is made as to whether the current period is the respective $Q^{th}$ period. If this is the case, in step 517 the minimum count value to be achieved may thus be reduced by the shortening value so that the decrement pulse 423 may be time-shifted. The counter for the periods is then reset in step 523. If the current period is not a $Q^{th}$ period, no reduction of the minimum count value takes place in step 518. Otherwise, an increase of the counter by a value of one for the periods takes place in step 524.

Figure 6:
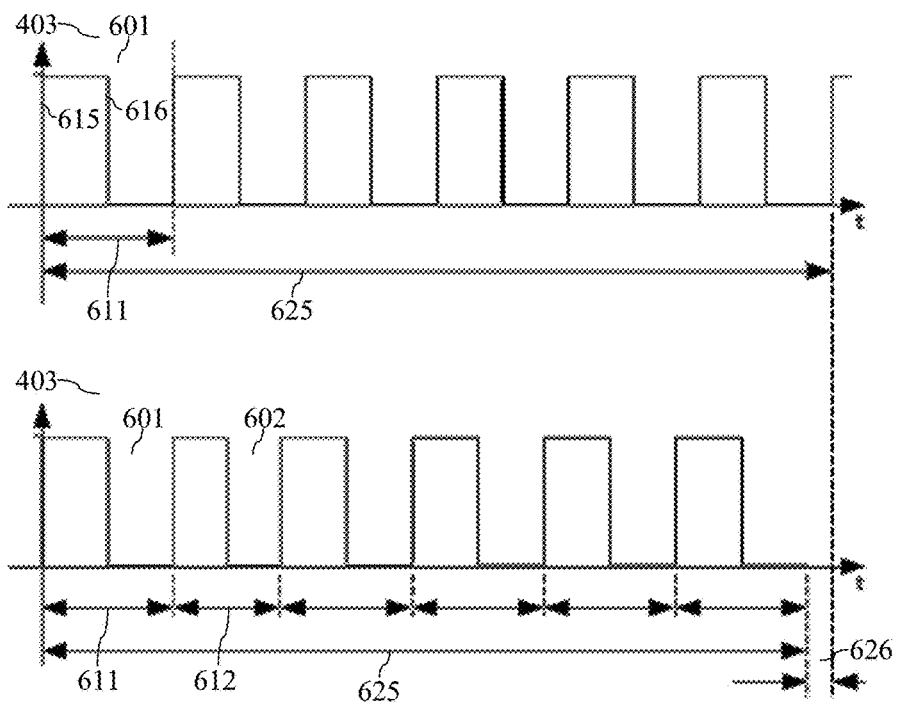
FIG. 6 illustrates examples of compensated encoder signals according to an exemplary embodiment.

FIG. 6 illustrates the generation of a compensated encoder signal 403 without use of a shortening value (upper part of FIG. 6) and with use of a shortening value (lower part of FIG. 6) according to an exemplary embodiment. In an exemplary embodiment, the compensated encoder signal 403 depicted in the upper part of FIG. 6 has a sequence of periods 601 with a respective rising output edge 615 and a falling output edge 616, wherein each period 601 has a defined period duration 611 that results from the method 510 without use of the shortening value. Q periods 601 of the compensated encoder signal 601 then have a line duration 625. Otherwise, for the compensated encoder signal 403 the minimum count value for a period 602 has been shortened by the shortening value in the lower part of FIG. 6, such that a shortened period duration 612 results. Consequently, Q periods 601, 602 of the compensated encoder signal 403 also have a line duration 625 shortened by the shortening time 626. It may thus be achieved that, apart from a general shortening delay, the output edges 615, 616 of the compensated encoder signal 403 follow optimally promptly after the corresponding input edges 315, 316 of the original encoder signal 303.

The minimum period count value of the print period count value for a period, for example the rounded-up whole-number value of $T_{min}/(QT_{zt})$, may be an even number $Z_{min}$. In this instance, in steps 516, 517, 518 a check may be made as to whether the print period count value has the minimum count value for an output edge, meaning $Z_{min}/2$, in order to produce where applicable a decrement pulse 423 for generation of a rising output edge 615 of the compensated encoder signal 403 (step 516) or a decrement pulse 423 for generation of a falling output edge 616 of the compensated encoder signal 403 (steps 517 or 518). If $Z_{min}$ is an odd number, in step 516 the rounded-down value of $Z_{min}/2$ plus 1 may be used as a minimum count value for a rising output edge 615, and in steps 517, 518 the rounded-down value of $Z_{min}/2$ plus 1 may be used as a minimum count value for a falling output edge 616.

Figure 7:
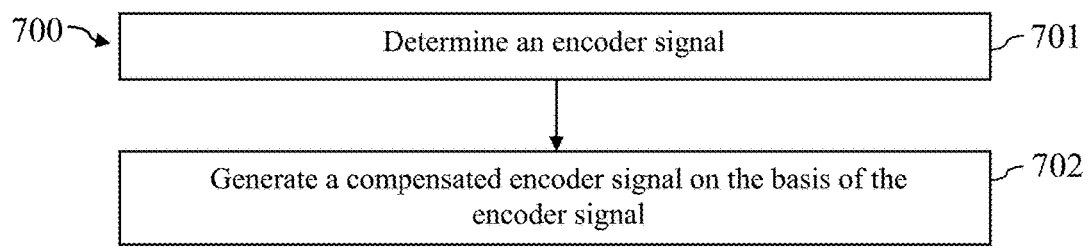
FIG. 7 illustrates a workflow diagram of a method for determining a compensated encoder signal according to an exemplary embodiment.

FIG. 7 shows a workflow diagram of an example of a method 700 for determining at least one compensated encoder signal 403 for the activation of dot generators of a printing device 100 for printing dots onto a recording medium 120 according to an exemplary embodiment. The dot generators may, for example, comprise the nozzles 104 of a print head 103. The compensated encoder signal 403 may be used to generate a line signal 305 with a sequence of line clock signals 306, wherein the line clock signals 306 establish the activation points in time for activation of the image generators.

The dot generators (for example the nozzles 104 of a print head 103) and the recording medium 120 exhibit a relative movement in a transport direction 1. In particular, the recording medium 120 may be directed past the (stationary) dot generators in the transport direction 1. A print image may then be printed line by line onto the recording medium 120, wherein a line travels transversal to the transport direction 1.

The line clock signals 306 of the line signal 305 then indicate the frequency with which lines of the print image are printed onto the recording medium 120 or with which the dot generators are activated.

In an exemplary embodiment, the method 700 comprises the determination 701 of at least one encoder signal 303 by means of an encoder 110. For example, an A track encoder signal 303 and a B track encoder signal 303 may be determined. The encoder 110 is configured to detect a dimension of the relative movement between the dot generators and the recording medium 120 in the transport direction 1. The encoder signal 303 comprises a sequence of input edges 315, 316. The time interval between the input edges 315, 316 thereby indicates a dimension of the relative movement, in particular a route traveled by the recording medium 120.

The encoder signal 303 is designed such that said encoder signal 303, averaged over time, enables a target dot resolution B in the transport direction 1 if the dot generators are activated according to the encoder signal 303 or according to the encoder signal 303 down-clocked by a factor Q. Q is thereby a whole number, with Q≥1, (in particular Q>1, for example Q=6 or Q=12). In other words, the encoder signal 303 may be designed such that the line signal 305 derived from the encoder signal 303, averaged over time, produces the target dot resolution B. As a result of this, the encoder signal 303 typically exhibits a jitter 311. In particular, the encoder signal 303 typically has periods 304 with different period durations 312, 313, 314. As described in this document, this may lead to the line signal 305 generated from the encoder signal 303 at least temporarily exceeding a maximum activation frequency of the dot generators, and thus negatively affecting the printing device 100.

In an exemplary embodiment, the method 700 additionally includes the generation 702 of a sequence of output edges 615, 616 of the compensated encoder signal 403, said sequence corresponding to the sequence of input edges 315, 316. In particular, a sequence of output edges 615, 616 for a compensated A track encoder signal 403 and a sequence of output edges 615, 616 for a compensated B track encoder signal 403 may be determined. A sequence of output edges 615, 616 is thereby generated such that, upon activation of the dot generators according to the compensated encoder signal 403, or according to the compensated encoder signal 403 down-clocked by the factor Q, not only is the target dot resolution B in the transport direction 1 achieved, averaged over time, but also the maximum activation frequency of the dot generators is not exceeded. This may in particular be achieved in that the time intervals between the input edges 315, 316 of the sequence of input edges 315, 316 are at least partially modified in order to generate the corresponding sequence of output edges 615, 616. Given an otherwise empty edge counter, relatively slow input edges 315, 316 are passed on to the output within a time period of $3*T_{zt}$. Given a slow input edge 315, 316, the minimum period count value is thereby always achieved from edge to edge.

In an exemplary embodiment, a method 700 is thus described via which the input edges 315, 316 of the encoder signal 303 of an encoder 110 are transformed into a compensated encoder signal 403 in that requirements both with regard to a target dot resolution of the printing device 100 and with regard to the maximum activation frequency of the dot generators of the printing device 100 are satisfied. The compensated encoder signal 403 then enables a high print quality, even at relatively high print speeds and/or dot resolutions.

In an exemplary embodiment, within the scope of the method 700, a corresponding output edge 615, 616 of the compensated encoder signal 403 is typically generated for each input edge 315, 316 of the encoder signal 303. It may thus be efficiently ensured that the compensated encoder signal 403 also enables the target dot resolution. Furthermore, for at least some of the output edges 615, 616, the time interval between the output edges 615, 616 may be modified relative to the time interval between corresponding input edges 315, 316. Via the adaptation of the time intervals, it may be produced that the maximum activation frequency of the dot generators is not exceeded by the compensated encoder signal 403.

It is noted that, if necessary, a compensation of both the time length of the high phases and the time length of the low phases may take place. The symmetry of the compensated encoder signal 403 is thereby improved.

In an exemplary embodiment, the encoder signal 303 may comprise rising input edges 315 and falling input edges 316 in alternation. In particular, the encoder signal 303 may include a square wave signal that fluctuates between a first level and a second level. A pair made up of rising input edge 315 and directly following falling input edge 316 thereby forms a period 304 with a period duration 312, 313, 314. In particular, the period duration 312, 313, 314 corresponds to a time interval of two rising input edges 315 in direct succession. The period duration 312, 313, 314 of the encoder signal 303 may thereby have a defined mean value. Furthermore, the period duration 312, 313, 314 may have jitter or fluctuations 311 with a defined standard deviation or variance.

In an exemplary embodiment, the compensated encoder signal 403 may be determined such that said compensated encoder signal 403 may also comprise rising output edges 615 and falling output edges 616 in alternation, wherein a rising output edge 615 and a directly following falling output edge 616 form a period 601, 602 of the compensated encoder signal 403. In particular, the compensated encoder signal 403 may comprise a square wave signal that fluctuates between a first level and a second level. The period duration 611, 612 of the periods 601, 602 of the compensated encoder signal 403 may correspond to the time interval of two rising output edges 615 in direct succession. The mean value of the period duration 611, 612 of the periods 601, 602 of the compensated encoder signal 403 and the mean value of the period durations 312, 313, 314 of the period 304 of the encoder signal 303 are typically identical. On the other hand, the standard deviation or variance of the period durations 611, 612 of the compensated encoder signal 403 may be smaller than the standard deviation or variance of the period durations 312, 313, 314 of the encoder signal 303. The aforementioned conditions with regard to the dot resolution and with regard to the maximum activation frequency may thus be reliably satisfied.

In an exemplary embodiment, a period of the compensated encoder signal 403 down-clocked by the factor Q may be produced from Q periods 601, 602 of the compensated encoder signal 403. In particular, a line clock signal 306 of the line signal 305 may respectively be generated after Q periods 601, 602 of the compensated encoder signal 403, wherein the dot generators may be activated at each line clock signal 306 in order to print a line of the print image. The dot resolution of the printing device 100 may be flexibly adapted via adaptation of the factor Q.

In an exemplary embodiment, the method 700 may additionally include the detection 502, 503 of an input edge 315, 316 of the encoder signal 303. In reaction to this, an edge count value 422 may then be increased (step 506 in FIG. 5*a*). Furthermore, within the scope of the method 700 it may be determined (steps 522, 524, 524 in FIG. 5*b*) that an output edge 615, 616 of the compensated encoder signal 403 should be generated. For example, this may be indicated via the generation of a decrement pulse 423. In reaction to the fact that it has been determined that an output edge 615, 616 should be generated, the edge count value 422 may be reduced (step 508 in FIG. 5*a*). It may thus be reliably ensured that the edge count value 422 indicates the number of input edges 315, 316 for which no corresponding output edge 615, 616 has been generated. Furthermore, it may thus be produced that precisely one corresponding output edge 615, 616 is generated for all input edges 315, 316.

In an exemplary embodiment, the method 700 may additionally include the detection 512 of a timing pulse signal of a timing pulse. The timing pulse may, for example, be produced by an oscillator. The timing pulse signals may have a substantially constant time interval relative to one another. For example, the timing pulse may have a timing pulse signal frequency of 30 MHz or more.

In an exemplary embodiment, a print period count value may be increased in reaction to the detection 512 of a timing pulse signal (step 513 in FIG. 5*b*). On the other hand, a resetting 522, 523, 524 of the print period count value may take place in reaction to the determination 522, 523, 524 that an output edge 615, 616 should be generated. The print period count value may thus indicate the time that has elapsed since the generation of the last output edge 615, 616. The time interval between the output edges 615, 616 may thus be reliably set.

In an exemplary embodiment, the method 700 includes the comparison 516, 517, 518 of the print period count value with a minimum count value. The minimum count value thereby typically depends on the maximum activation frequency of the dot generators. In particular, the minimum count value may indicate a time interval between the output edges 615, 616 via which it is ensured that the maximum activation frequency is not exceeded.

It may then be determined (steps 522, 523, 524 in FIG. 5*b*) that an output edge 615, 616 of the compensated encoder signal 403 should be generated via a decrement pulse 423 if the print period count value has reached at least the minimum count value, and if the edge count value 422 indicates that an input edge 315, 316 has been detected for which an output edge 615, 616 has not yet been generated. The aforementioned conditions with regard to the dot resolution and with regard to the maximum activation frequency may thus be reliably complied with.

In an exemplary embodiment, within the scope of the method, the compensated encoder signal 403 down-clocked by the factor Q is generated with Q>1, and the dot generators may be activated with the compensated encoder signal 403 down-clocked by the factor Q, in particular with the line signal 305.

The timing pulse typically has a limited time resolution of timing pulse signals. The limited time resolution of the timing pulse may lead to the situation that the whole-number minimum count value calculated from the maximum activation frequency leads to a limited activation frequency of the dot generators that is lower by a difference frequency than the maximum activation frequency. The minimum count value is typically rounded up to a whole number such that the activation frequency of the dot generators is safely not exceeded. This may lead, in particular given a relatively low time resolution of line clock signals, to the situation that the edge count value builds up over time since the output edges 615, 616 cannot be generated quickly enough. This may in turn lead to print image artifacts, in particular in multicolor printing.

In an exemplary embodiment, within the scope of the method 700, the minimum count value is therefore reduced by a shortening value for the generation of a portion of the sequence of output edges 615, 616 (step 517 in FIG. 5*b*). The shortening value may thereby be limited depending on the difference frequency. For example, the minimum count value may be reduced by the shortening value for every $Q^{th}$ output edge 615, 616, in particular for every $Q^{th}$ rising output edge 615 or for every $Q^{th}$ falling output edge 616. It may thus be produced that the compensated encoder signal 403 down-clocked by the factor Q enables activation frequencies that are relatively close to the maximum activation frequency.

A minimum period count value for the generation of the rising output edge 615 and the directly following falling output edge 616 of a period 601, 602 of the compensated encoder signal 403 typically depends on the maximum activation frequency and on the factor Q. The minimum count value for the generation of the rising output edge 615 and the minimum count value for the generation of the directly following falling output edge 616 may then respectively amount to half of the minimum period count value, in particular if the minimum period count value is an even number. Furthermore, the minimum count value for the generation of the rising output edge 615 or the minimum count value for the generation of the directly following falling output edge 616 may be greater by a counter value (for example one) than the respective other minimum count value if the minimum period count value is an odd number. Activation frequencies may thus be enabled that are relatively close to the maximum activation frequency.

Furthermore, embodiments of a compensator 402 is described for determination of at least one compensated encoder signal 403 for the activation of dot generators of a printing device 100 for printing dots onto a recording medium 120.

In an exemplary embodiment, the compensator 402 is configured to receive at least one encoder signal 303 of an encoder 110. The encoder 110 thereby serves to detect a dimension of a relative movement between the dot generators and the recording medium 120 in the transport direction 1. Averaged over time, the encoder signal 303 thereby enables a target dot resolution B in the transport direction 1 if the dot generators are activated according to the encoder signal 303 or according to the encoder signal 303 down-clocked by a factor Q.

Moreover, in an exemplary embodiment, the compensator 402 is configured to produce a sequence of output edges 615, 616 of the compensated encoder signal 403 corresponding to the sequence of input edges 315, 316 such that, upon activation of the dot generators according to the compensated encoder signal 403 or according to the compensated encoder signal 403 down-clocked by the factor Q, the target dot resolution B in the transport direction 1 is achieved, averaged over time, and a maximum activation frequency of the dot generators is not exceeded.

In an exemplary embodiment, the compensator 402 comprises at least one oscillator that is configured to generate a timing pulse with a sequence of temporally periodic timing pulse signals. The compensated encoder signal 403 may then be generated depending on the timing pulse. It may thus be reliably ensured that the maximum activation frequency is not exceeded.

The input edges 315, 316 of the sequence of input edges 315, 316 are chronologically placed at a corresponding sequence of points in time relative to a starting point in time. The starting point in time may, for example, correspond to the point in time of a first input edge of the sequence of input edges 315, 316. The compensator 402 may then be configured to generate the sequence of output edges 615, 616, in particular depending on the timing pulse, such that the output edges 615, 616 of the sequence of output edges 615, 616 are placed at least in part at different points in time relative to the starting point in time than the input edges 315, 316. The starting point in time may thereby correspond to a corresponding first output edge of the sequence of output edges 615, 616. The compensator 402 may thus be configured to adapt the time intervals between the input edges 315, 316 in order to ensure that the maximum activation frequency is not exceeded by the compensated encoder signal 403.

The measures described in the present disclosure enable a compensated encoder signal 403 to be provided with which temporary exceedances of the maximum activation frequency of the dot generators of a printing device 100 may be reliably avoided. In particular, exceedances may thereby be avoided that are to be ascribed to jitter 311 of the encoder signal 303 of an encoder 110 and/or that are to be ascribed to velocity fluctuations of the recording medium 120.

Figure 8:
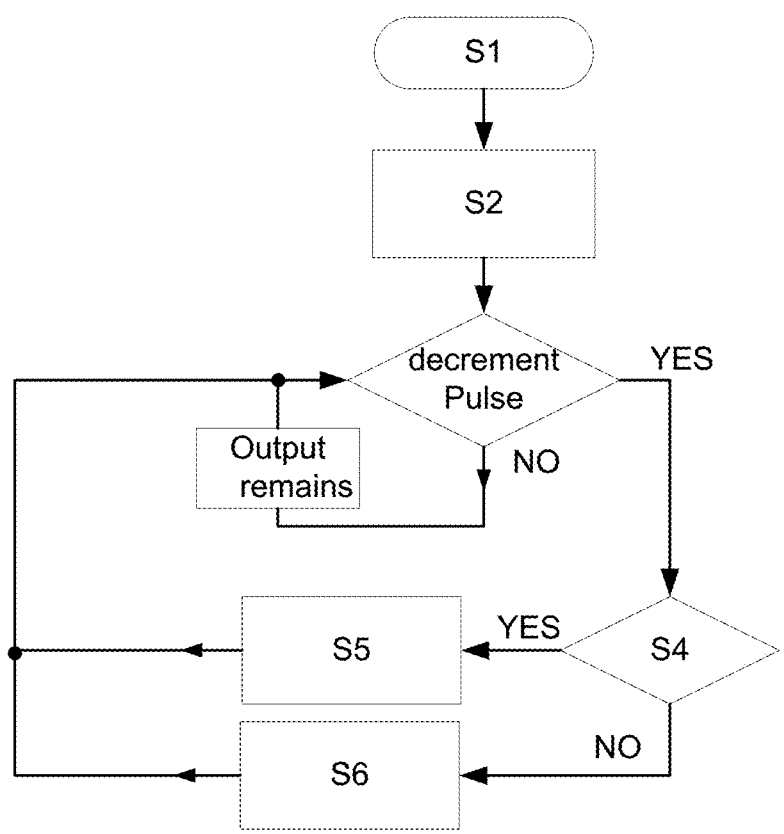
FIG. 8 illustrates a workflow diagram of a method for generating the output signal of a compensated encoder signal according to an exemplary embodiment.

A workflow diagram for the output signal generation is shown in FIG. 8. There are no different decrement pulses 423 for the generation of rising/falling edges or output level of the compensated encoder signal 403.

The workflow diagram shows when and how the compensated encoder signal 403 changes according to an embodiment. In step S1, an initialization/start phase is performed. In step S2, a synchronization occurs between the encoder signals 303 and the compensated encoder signals 403, which in particular takes place after a system reset. In step S4, a check is made as to which value the edge count value 422 and/or the decrement pulse 423 has. If the edge count value 422 or the decrement pulse 423 is thereby equal to one, step S5 follows, in that a synchronization likewise takes place between the encoder signals 303 and the compensated encoder signals 403. By contrast, if it is established in step S4 that the decrement pulse 423 and/or edge count value 422 is greater than one, in step S6 a "toggling" is performed, meaning that the output state of the compensated encoder signal 423 is inverted.

The separation between the detection of the input signal information (edge change) and the composition and generation of output signals using the established information in connection with adjustable parameters enables a very effective mechanism in order to avoid exceedances of maximum permissible frequencies (for example activation frequencies for print heads). Since detection and generation are not rigidly coupled with one another, an information loss (number of edge changes) is prevented in that the detected number of edge changes produces the same number of edge changes of the output signals. By "storing" edges in phases with velocities above the parameterized values (due to jitter or synchronization fluctuations) and the execution of the "stored" values with constant speed in phases with lower velocities (in relation to a mean print speed), a general averaging of the velocity fluctuations of the activation signals takes place for the print heads.

The certainty in the generation of the output signals is increased in that, whenever possible, a direct synchronization between input signals and output signals occurs. The mechanism independently takes care of a transition-less "merging" of output/input signals. Given print speeds near to the permissible maximum velocity, this is especially important in order to equalize the irregularities occurring there.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, other structural electronic hardware, or a combination thereof. A processor includes a microprocessor, a digital signal processor (DSP), central processing unit (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

REFERENCE LIST 1 transport direction
100 printing device
101 controller of the printing device 100
102 print bar
103 print head
104 nozzle
110 encoder
120 recording medium
200 rotary encoder
201 encoder roller
202 disc
203 photodetector
204 light-emitting diode
205 slit
301 base signal
302 base clock signal
303 encoder signal
304 period (of the encoder signal)
305 line signal
306 line clock signal
311 jitter
312 average period duration
313 minimum period duration
314 maximum period duration
315 rising input edge
316 falling input edge
401 activator
402 compensator
403 compensated encoder signal
410 parameter generator
411 detector
412 edge counter
413 monitor
414 signal generator
421 edge pulse
422 edge count value
423 decrement pulse
500 method to determine an edge count value
501-508 method steps
510 method to produce a decrement pulse
511-524 method steps
601-602 period (of the compensated encoder signal)
611-612 period duration
615 rising output edge
616 falling output edge
625 line duration
626 shortening time
700 method to determine a compensated encoder signal
701-702 method steps

The invention claimed is:

1. A method for stabilizing at least one encoder signal for the activation of dot generators of a printing device to print dots onto a recording medium, the method comprising:
determining at least one encoder signal by an encoder configured to detect a dimension of a relative movement between the dot generators and the recording medium in a transport direction, the encoder signal including a sequence of input edges, wherein the encoder signal, averaged over time, enables a target dot resolution in the transport direction if the dot generators are activated according to the encoder signal or according to the encoder signal down-clocked by a factor Q, wherein Q is a whole number with Q≥1; and
generating a sequence of output edges of the compensated encoder signal, the sequence corresponding to the sequence of input edges, wherein, upon activation of the dot generators according to the compensated encoder signal or according to the compensated encoder signal down-clocked by the factor Q:
averaged over time, the target dot resolution B in the transport direction is achieved; and
a maximum activation frequency of the dot generators is not exceeded.

2. The method according to claim 1, further comprising:
generating a corresponding output edge of the compensated encoder signal for each input edge of the encoder signal; and
varying a time interval between output edges relative to a time interval between corresponding input edges.

3. The method according to claim 1, further comprising:
detecting an input edge of the encoder signal;
increasing an edge count value in reaction to the detection of an input edge;
determining that an output edge of the compensated encoder signal should be generated; and
in response to the determination that an output edge should be generated, reducing the edge count value so that the edge count value indicates a number of input edges for which a corresponding output edge has not yet been generated.

4. The method according to claim 3, further comprising:
detecting a timing pulse signal of a timing pulse;
increasing a print period count value based on the detection of a timing pulse signal; and
in response to the determination that an output edge should be generated, resetting the print period count value so that the print period count value indicates a time elapsed since the generation of the last output edge.

5. The method according to claim 4, further comprising:
comparing the print period count value with a minimum count value, wherein:
the minimum count value depends on the maximum activation frequency; and
it is determined that an output edge of the compensated encoder signal should be generated if the print period count value has reached at least the minimum count value and if the edge count value indicates that an input edge has been detected for which an output edge has not yet been generated.

6. The method according to claim 5, further comprising:
determining the compensated encoder signal down-clocked by the factor Q, with Q>1; and
activating the dot generators with the compensated encoder signal down-clocked by the factor Q,
wherein the timing pulse has a limited time resolution of timing pulse signals, the limited time resolution of the timing pulse causing the whole-number minimum count value calculated from the maximum activation frequency to produce a limited activation frequency of the dot generators that is smaller by a difference frequency from the maximum activation frequency.

7. The method according to claim 6, further comprising:
reducing the minimum count value for the generation of a portion of the sequence of output edges by a shortening value, the shortening value being limited based on the difference frequency.

8. The method according to claim 1, wherein:
the encoder signal comprises alternating rising input edges and falling input edges;
the compensated encoder signal is determined such that the compensated encoder signal comprises alternating rising output edges and falling output edges;
a rising output edge and a directly following falling output edge form a period of the compensated encoder signal; and
a period of the compensated encoder signal down-clocked by the factor Q is produced from Q periods of the compensated encoder signal.

9. The method according to claim 8, wherein:
a minimum period count value for the generation of the rising output edge and the directly following falling output edge of a period of the compensated encoder signal depends on the maximum activation frequency and on the factor Q;
the minimum count value for the generation of the rising output edge and the minimum count value for the generation of the directly following falling output edge is respectively half of the minimum period count value if the minimum period count value is an even number; and
the minimum count value for the generation of the rising output edge or the minimum count value for the generation of the directly following falling output edge is greater by a counter value than the respective other minimum count value if the minimum period count value is an odd number.

10. A non-transitory computer-readable storage medium with an executable program stored thereon, that when executed, causes a processor to perform the method of claim 1.

11. A compensator operable to determine at least one compensated encoder signal to activate dot generators of a printing device operable to print dots onto a recording medium, the compensator comprising:

a detector configured to receive at least one encoder signal of an encoder to detect a dimension of a relative movement between the dot generators and the recording medium in a transport direction, the encoder signal including a sequence of input edges, wherein the encoder signal, averaged over time, enables a target dot resolution in the transport direction if the dot generators are activated according to the encoder signal or according to the encoder signal down-clocked by a factor Q, wherein Q is a whole number with $Q \geq 1$; and a sequence generator configured to generate a sequence of output edges of the compensated encoder signal, the sequence corresponding to the sequence of input edges, wherein: upon activation of the dot generators according to the compensated encoder signal or according to the compensated encoder signal down-clocked by the factor Q, averaged over time, the target dot resolution is achieved in the transport direction, and a maximum activation frequency of the dot generators is not exceeded.

12. The compensator according to claim 11, wherein:

the compensator comprises at least one oscillator that is configured to generate a timing pulse with a sequence of chronologically periodic timing pulse signals;

the input edges of the sequence of input edges are chronologically placed at a corresponding sequence of points in time relative to a starting point in time; and the compensator is further configured to generate the sequence of output edges based on the timing pulse such that the output edges of the sequence of output edges are placed at least in part at different points in time, relative to the starting point in time, than the input edges.

13. A printing system comprising the compensator according to claim 11.

* * * * *